US012809261B2

(12) United States Patent
Hwang et al.

(10) Patent No.: US 12,809,261 B2
(45) Date of Patent: Nov. 24, 2026

(54) LITHOGRAPHY TRACK SYSTEM

(71) Applicant: Samsung Electronics Co., Ltd., Suwon-si (KR)

(72) Inventors: Sungkun Hwang, Suwon-si (KR); Jeonggil Kim, Suwon-si (KR); Janghee Lee, Suwon-si (KR); Woojin Jung, Suwon-si (KR); Dongwook Kim, Suwon-si (KR); Yonghoon Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 78 days.

(21) Appl. No.: 18/899,570

(22) Filed: Sep. 27, 2024

(65) Prior Publication Data

US 2025/0264803 A1 Aug. 21, 2025

(30) Foreign Application Priority Data

Feb. 15, 2024 (KR) ........................ 10-2024-0021764

(51) Int. Cl.

| | |
|---|---|
| ***H10P 76/20*** | (2026.01) |
| ***G03F 7/16*** | (2006.01) |
| ***H10P 72/00*** | (2026.01) |
| ***H10P 72/30*** | (2026.01) |

(52) U.S. Cl.

CPC .......... *G03F 7/168* (2013.01); *H10P 72/0461* (2026.01); *H10P 72/3302* (2026.01); *H10P 76/2041* (2026.01)

(58) Field of Classification Search

CPC ........ G03F 7/168; G03F 7/167; G03F 7/2004; G03F 7/36; G03F 7/38; H10P 72/0461; H10P 72/3302; H10P 76/2041; H10P 72/0456; H10P 72/0474; H10P 72/0406; H10P 72/0452

See application file for complete search history.

(56) References Cited

U.S. PATENT DOCUMENTS

| | | | | |
|---|---|---|---|---|
| 4,241,165 | A * | 12/1980 | Hughes | G03F 7/36 430/329 |
| 7,145,643 | B2 * | 12/2006 | Auer-Jongepier | G03F 7/7075 355/72 |
| 11,658,051 | B2 * | 5/2023 | Babbs | H10P 72/1916 414/217 |
| 12,278,125 | B2 * | 4/2025 | Yu | G03F 7/168 |
| 2008/0224817 | A1 * | 9/2008 | Vellore | G01K 1/14 338/25 |
| 2008/0266538 | A1 | 10/2008 | Kruijswijk et al. | |

(Continued)

FOREIGN PATENT DOCUMENTS

WO 2020264571 A1 12/2020

*Primary Examiner* — Hung V Nguyen

(74) *Attorney, Agent, or Firm* — Wolf, Greenfield & Sacks, P.C.

(57) ABSTRACT

A lithography track system includes a plurality of process modules each configured to perform a photolithography process on a wafer, a transfer module configured to transfer the wafer between the plurality of process modules, a scanner at one end of the transfer module and configured to expose a photoresist material on the wafer, and a first interface box sharing the transfer module and configured to transfer the wafer to the scanner and to match vacuum degrees of the transfer module and the scanner.

17 Claims, 8 Drawing Sheets

(56) References Cited

U.S. PATENT DOCUMENTS

| | | | |
|---|---|---|---|
| 2015/0221519 | A1 | 8/2015 | Marks et al. |
| 2018/0366348 | A1 | 12/2018 | Cho et al. |
| 2020/0152486 | A1 | 5/2020 | Kim et al. |
| 2023/0244150 | A1 | 8/2023 | Jeong et al. |

* cited by examiner

LITHOGRAPHY TRACK SYSTEM

CROSS-REFERENCE TO RELATED APPLICATION(S)

This application claims benefit of priority to Korean Patent Application No. 10-2024-0021764, filed on Feb. 15, 2024 in the Korean Intellectual Property Office, the disclosure of which is incorporated herein by reference in its entirety.

BACKGROUND

The present inventive concept relates to a lithography track system.

The manufacturing of semiconductor devices, such as integrated circuits, is a multi-step process including a photolithography process.

Generally, a semiconductor manufacturing process includes depositing a material on a wafer and patterning the material through lithographic techniques to form structural features (e.g., transistors and circuits) of semiconductor devices.

The lithography process includes applying photoresist on a semiconductor wafer (i.e., performing spin-coating); exposing the applied photoresist with a scanner; baking the exposed wafer; performing developing with a developing solution to remove an exposed region of the photoresist on the wafer; and performing additional processing, such as etching or material deposition, cleaning, and the like.

As patterns on semiconductor chips have become more refined, a dry photoresist process of using dry photoresist and performing a dry developing process, rather than using wet photoresist or wet developing solution, and equipment suitable therefor is under development.

In addition, an all-in-one track system in which all processes are integrated and automated to ensure mass production and productivity of semiconductor chips has been introduced. Although an all-in-one system for a dry photo process has been developed, a scanner device for exposure is configured as a stand-alone device that is not connected in-line, and thus, a problem arises in that a wafer movement process should be operated independently between an all-in-one track and a scanner.

There is also a problem that a wafer can be contaminated by metal reaction by-products in the scanner and a front opening unified pod (FOUP) and a transfer module are contaminated due to metal outgassing.

Independent stand-alone scanners have various process delays, such as post-coating delay (PCD), post exposure delay (PED), and post exposure bake (PEB) delay, post dry develop delay (PDDD) is caused, which causes a problem that a critical dimension (CD) is drifted and is also accompanied by a problem of productivity deterioration.

SUMMARY

An aspect of the present inventive concept is to provide a lithography track system in which a scanner is in-line in a track system that continuously performs a dry photolithography process.

An aspect of the present inventive concept is to provide a lithography track system including an interface box of transferring a wafer under normal pressure that has undergone a dry photo process in an in-line lithography track system to a scanner in a vacuum state through a wafer transporter of a track.

An aspect of the present inventive concept is to provide a lithography track system installed at the entrance of a processing chamber and including an interface box of transferring a wafer under normal pressure to a processing chamber under vacuum through a wafer transporter of a track.

According to an aspect of the present inventive concept, a lithography track system includes a plurality of process modules each configured to perform a photolithography process on a wafer, a transfer module configured to transfer the wafer between the plurality of process modules, a scanner at one end of the transfer module and configured to expose a photoresist material on the wafer, and a first interface box sharing the transfer module and configured to transfer the wafer to the scanner and to match vacuum degrees or levels of the transfer module and the scanner.

According to an aspect of the present inventive concept, a lithography track system, in which a wafer is sequentially transferred to a plurality of process modules and processed sequentially or simultaneously in the plurality of process modules, includes a transfer module configured to transfer the wafer between the plurality of process modules, wherein the plurality of process modules include a coating process module configured to dry-coat the wafer with photoresist, a scanner configured to expose the coated wafer to electromagnetic radiation, a baking process module configured to dry-bake the coated or exposed wafer, and a dry development module configured to dry-remove the exposed wafer or a pattern thereon, wherein a first interface box configured to match a vacuum degree or level with the scanner is at an introduction side of the scanner.

According to an aspect of the present inventive concept, a lithography track system includes an equipment front-end module configured to supply a wafer, a plurality of process modules configured to sequentially or simultaneously process the wafer, a transfer module having a first end connected to the equipment front-end module and configured to transfer the wafer, and a second interface box configured to move the wafer to and from the transfer module between at least one of the plurality of process modules and the transfer module.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
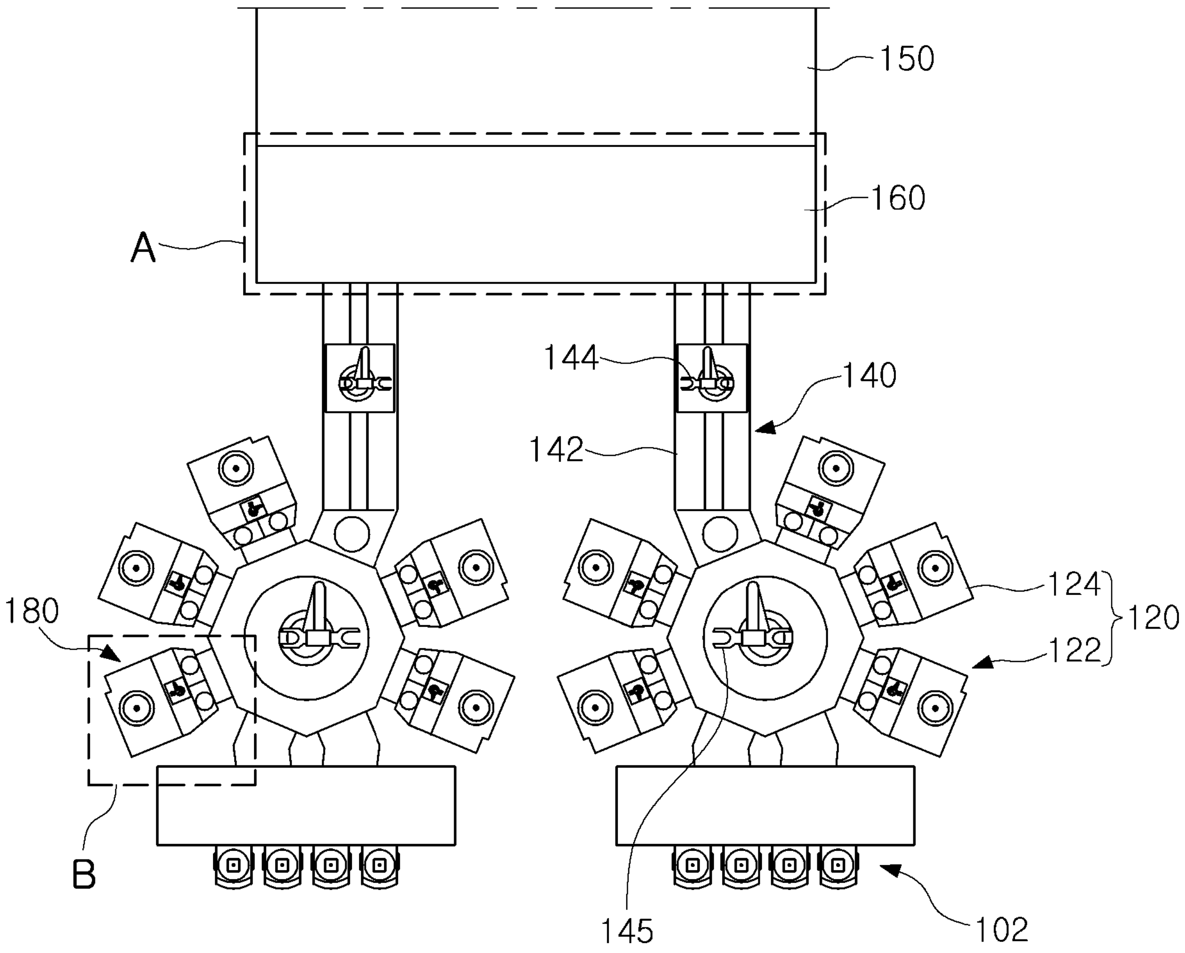
FIG. 1 is a schematic diagram of a cluster-type lithography track system according to example embodiments of the present inventive concept.

Hereinafter, example embodiments in the present inventive concept will be described in detail with reference to the accompanying drawings.

The example embodiments of the present inventive concept may be modified into other forms and are provided so that this disclosure will be thorough and complete and will fully convey the scope of the invention to those of ordinary skill in the art. In the drawings, the shapes and dimensions of elements may be exaggerated for clarity, and like reference numerals denote like elements.

In the present disclosure, the meaning of a "connection" of a component to another component includes an indirect connection through another element as well as a direct connection between two components. In addition, in some cases, the meaning of "connection" includes all "electrical connections."

It may be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The terms used in the present disclosure are used to describe example embodiments and are not intended to limit the present inventive concept. A singular term includes a plural form unless otherwise indicated.

Figure 2:
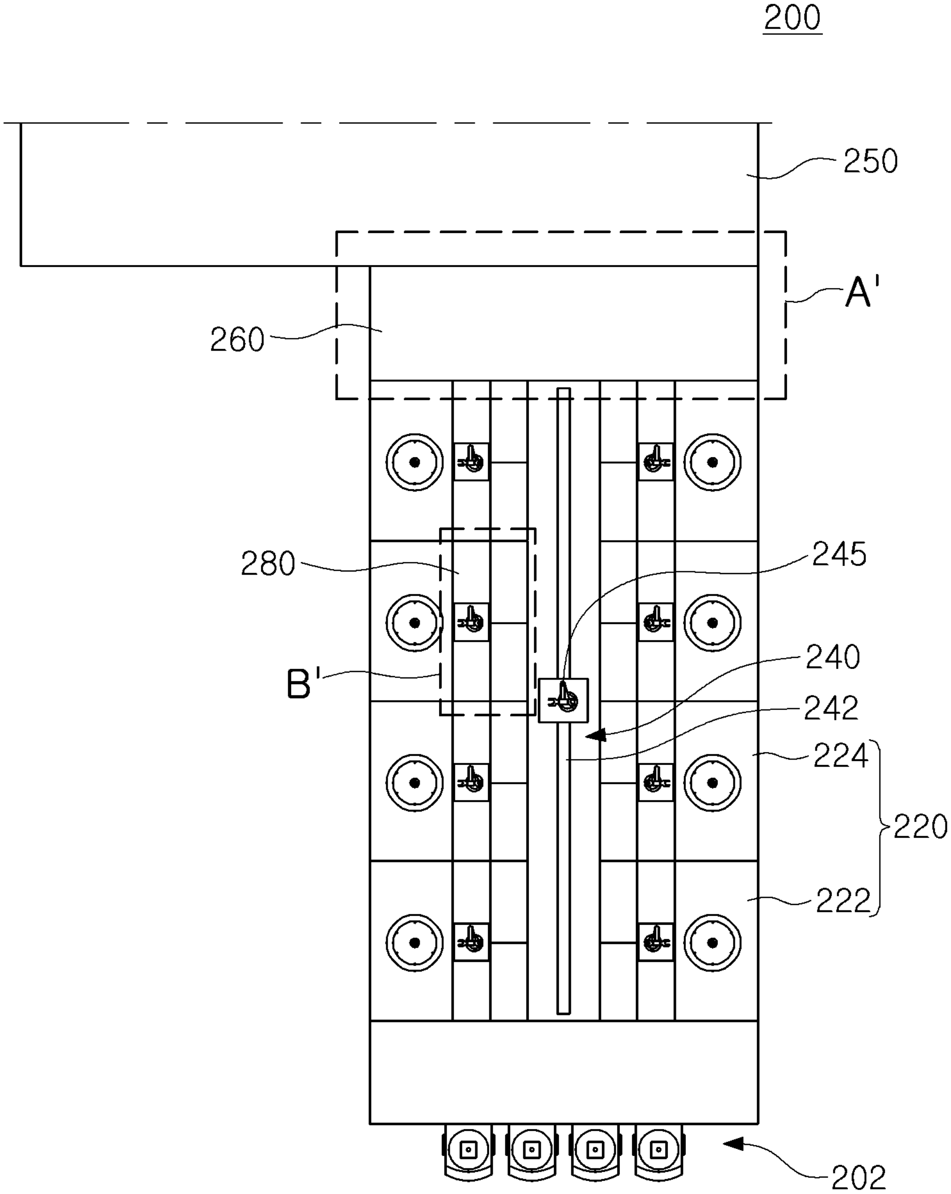
FIG. 2 is a schematic diagram of a track-type lithography track system according to example embodiments of the present inventive concept.

FIG. 1 is a schematic diagram of a cluster-type lithography track system according to example embodiments of the present inventive concept, and FIG. 2 is a schematic diagram of a track-type lithography track system according to example embodiments of the present inventive concept.

Referring to FIGS. 1 and 2, example embodiments of a lithography track system are disclosed in which a wafer W is sequentially transferred to a plurality of process modules and processed sequentially or simultaneously in the plurality of process modules.

FIG. 1 illustrates a cluster-type lithography track system in which a robot arm for transferring a wafer W to a process module is installed at the center of a polygonal table. FIG. 2 illustrates a track-type lithography track system in which multi-process modules are arranged on both or opposite sides of a transport module.

A cluster-type lithography track system 100 of FIG. 1 includes a plurality of process modules 120, a transfer module 140, a scanner 150, and a first interface box 160.

The plurality of process modules 120 include process modules 122, 124, . . . that perform respective semiconductor processes for a semiconductor photolithography process.

First, the cluster-type lithography track system 100 includes an equipment front-end module (EFEM) 102 supplying a wafer.

A photolithography process of the wafer W transferred from the EFEM 102 may be continuously performed in the plurality of process modules 120.

The plurality of process modules 120 may include a coating process module, a baking process module, and a dry development module.

The location or number of each of the process modules 122 and 124 may be arbitrarily changed depending on selection.

In the coating process module, a photoresist layer is deposited. This may be a dry deposition process, such as a vapor deposition process, or a wet process, such as a spin-on deposition process.

The photoresist may be a metal-containing extreme ultraviolet radiation (EUV) resist. EUV-sensitive metal or metal oxide-containing films may be used for wet (e.g., spin-on) or dry (e.g., chemical vapor deposition (CVD)) techniques.

In the present example embodiment, a dry photoresist process using dry photoresist and performing a dry developing process may be performed to further refine patterns on a semiconductor chip.

The fire process module is a process module used to process a post-application bake (PAB) after performing a photoresist deposition and after performing a bevel edge and/or backside cleaning or used to perform post-exposure bake (PEB) or post-development hard bake after EUV exposure.

The dry development module may be performed in a thermal processing chamber, such as a baking plate or oven. In some example embodiments, a method of depositing and developing a photoresist may include baking a metal-containing EUV resist at an increased temperature in the same processing chamber as that of dry developing the metal-containing EUV resist.

The scanner 150 exposes photoresist materials deposited on a semiconductor wafer to some types of electromagnetic radiation (e.g., extreme ultraviolet radiation (EUV)).

In addition, the process modules 122 and 124 may include a cleaning module of removing contamination from the wafer W. An optional cleaning process may be performed to clean the backside and/or beveled edges of the semiconductor substrate.

The cluster-type lithography track system 100 includes a transfer module system for transferring the wafer W between the process modules 122 and 124.

The transfer module system includes a transfer robot arm 145 for transferring the wafer and a transfer module 140 extending from one side of a polygonal cluster die or table to transfer the wafer W to the scanner 150.

The transfer module 140 includes a vacuum transport robot 144 (or a vacuum transport module) for transferring the wafer and a track 142 on which the vacuum transport robot 144 may move.

The scanner 150 is located at one end of the transfer module 140, and the wafer is moved to the scanner 150 for an exposure process through the transfer module 140. The wafer that has completely undergone the exposure process may be transferred from the scanner 150 to the process module 120.

The first interface box 160 may share the transfer module 140 in the cluster lithography track system 100, transfer the wafer W to the scanner 150, and match vacuum degrees of the transfer module 140 and the scanner 150.

The transfer module 140 may maintain a normal pressure or vacuum state, and since work is carried out in the vacuum state of the scanner 150, a separate load lock that may adjust a vacuum degree of the transfer module 140 to match the vacuum degree of the scanner 150 is required. The first interface box 160, which may control normal pressure or vacuum, performs the role of a load lock.

Since the first interface box 160 directly connects the scanner to a dry lithography facility, all photolithography processes may be performed as dry photolithography processes. Through the dry photolithographic process, patterns on semiconductor chips may become reliably further refined.

In addition, in the lithography track system 100 in which the scanner 150 is in-line, the exposure process may be performed continuously without moving to an external scanner, so a contamination problem of the wafer, a front-opening unified pod (FOUP), and the transfer module due to metal reaction by-products in the exposure process may be resolved. Since the cleaning process to remove contamination from the wafer is also reduced, the cost of installing a separate cleaning device may be reduced and process time and productivity may be improved.

Before introducing the wafer that has undergone the dry photography process into the scanner 150, a wafer handler operating under normal pressure conditions to move the wafer to the scanner 150 may be removed and the wafer may be directly moved to the scanner 150 through the transfer module 140 that passes through the first interface box 160 capable of vacuum adjustment, thereby eliminating vacuum degree matching delay for adjusting the vacuum degree at normal pressure.

A track-type lithography track system 200 of FIG. 2 includes a plurality of process modules 220, a transfer module 240, a scanner 250, and a first interface box 260.

The plurality of process modules 220 includes process modules 222, 224, . . . that perform each semiconductor process for a semiconductor photolithography process.

The plurality of process modules 220 performing the photolithography process of the wafer W may include a coating process module, a baking process module, and a dry development module, like the process module of the cluster-type lithography track system 100 of the example embodiment of FIG. 1.

The location or number of the process modules 222 and 224 may be arbitrarily changed depending on selection.

Descriptions of process modules common to FIG. 1 may be omitted in the interest of brevity.

One end of the track-type lithography track system 200 is connected to an EFEM 202, and the process modules 220 are arranged on both or opposite sides based on the transfer module 240 transferring the wafer W.

Like the transfer module 140 of the cluster-type lithography track system 100 of FIG. 1, the transfer module 240 includes a vacuum transfer robot (or a vacuum transport module) 245 for transferring the wafer and a track 242 on which the vacuum transfer robot 245 may move.

The scanner 250 may be located at one end of the transfer module 240, and the wafer is moved to the scanner 250 for an exposure process through the transfer module 240. The wafer that has completely undergone the exposure process may be transferred from the scanner 250 to the process module 220.

Figure 3:
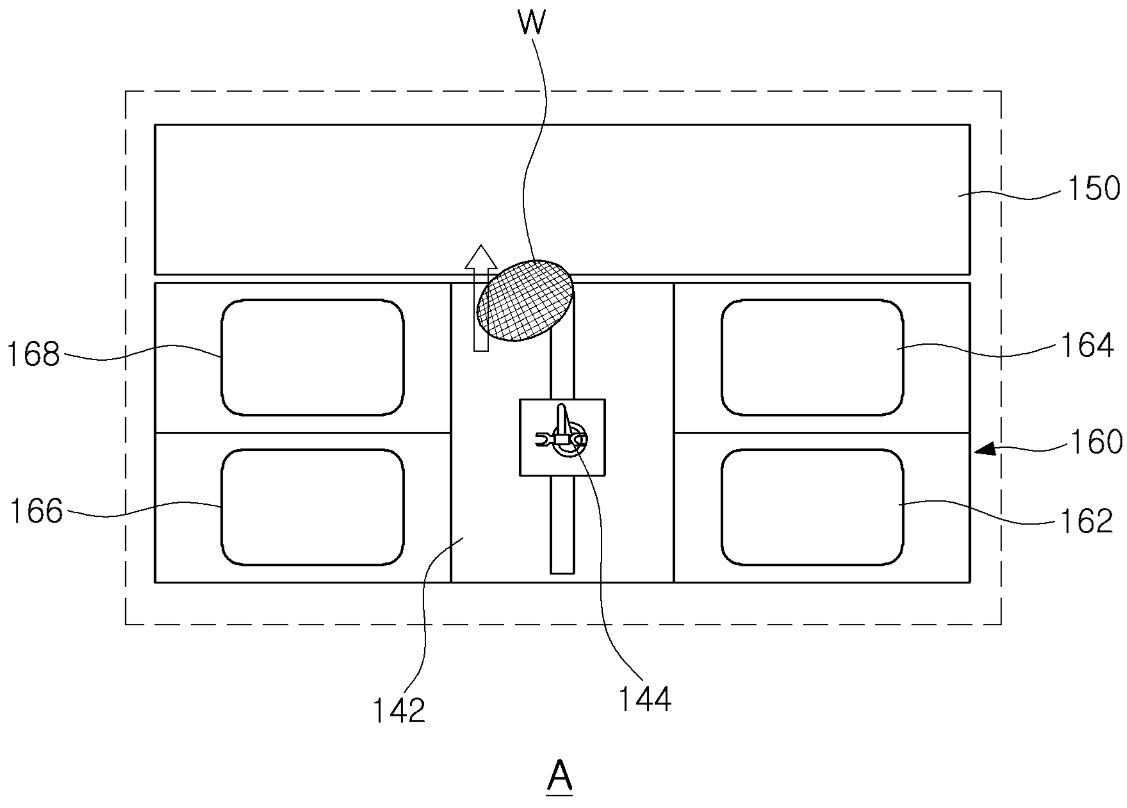
FIG. 3 is a schematic diagram illustrating portion A of FIG. 1 according to example embodiments of the present inventive concept.
Figure 4:
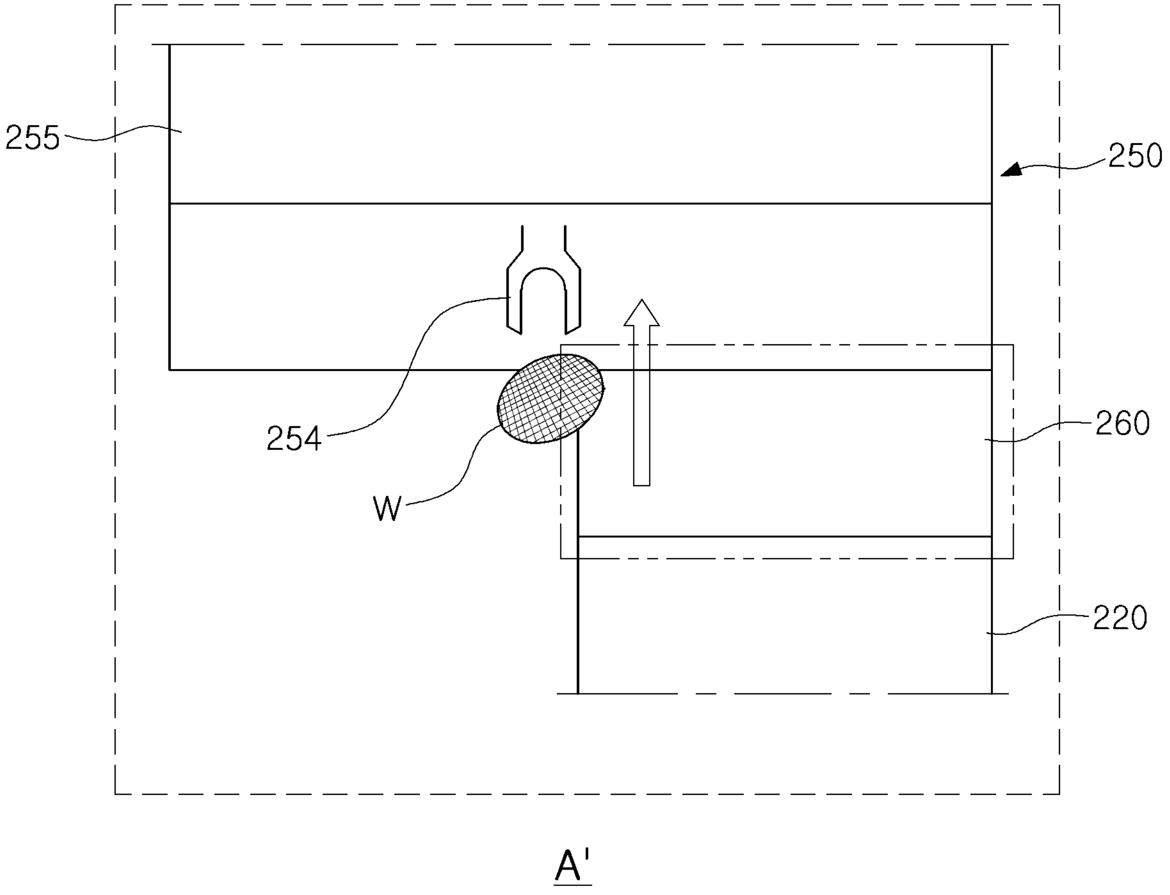
FIG. 4 is a schematic diagram illustrating portion A' of FIG. 2 according to example embodiments of the present inventive concept.

FIG. 3 is a schematic diagram illustrating portion A of FIG. 1 according to example embodiments, while FIG. 4 is a schematic diagram illustrating portion A' of FIG. 2 according to example embodiments.

FIGS. 3 and 4 illustrate the first interface boxes 160 and 260 of the cluster-type lithography track system and the track-type lithography track system, respectively.

Referring to FIGS. 3 and 4, the first interface boxes 160 and 260 include at least one of a baking process module 168, an alignment module 164, a buffer module 166, and a cleaning module 162.

The baking process module 168 may perform soft baking and post-exposure baking (PEB) required before and after exposure performed by the scanner 150.

The alignment module 164 may control the temperature of the wafer W before the wafer is introduced into the scanner and may also remove outgassing of metal-based reaction by-products occurring due to baking of the wafer W.

The buffer module 166 may serve to remove moisture from the first interface boxes 160 and 260 against the risk of critical dimension drift occurring within the wafer during an idle time before and after exposure in the scanners 150 and 250.

The cleaning module 162 may clean the wafer W in a wet or dry manner to perform bevel edge and back cleaning.

Within the first interface boxes 160 and 260, the transfer module 140 or 240 moves the wafer W with the scanners 150 and 250. A vacuum wafer handler 254 for receiving the wafer W in a vacuum state from the transfer module may be installed in the scanner 250.

Although the scanner wafer W is cleaned in the cleaning module 162, the inside of the transfer module 140 or 240 itself may be cleaned by connecting the transfer module 140 or 240 to a plasma device to prevent a space within the first interface boxes 160 and 260 from being contaminated due to metal outgassing or contamination of the wafer W during the process.

Within the first interface boxes 160 and 260, the transfer module 140 or 240 may be coupled to the plasma device.

The plasma device may be a direct plasma system or a remote plasma system and clean the inside of the transfer module 140 or 240 in a vacuum state against a problem in which contaminants may be introduced into the process module 120 or 220 of the photolithography, as well as to the scanners 150 and 250.

As described above, the first interface boxes 160 and 260 may be equipped with functional process modules capable of performing a necessary process before and after the exposure process, thereby timely performing the necessary processes before and after scanning to prevent contamination of the semiconductor wafer or additional problems that may arise, such as drift of a critical dimension.

Figure 5:
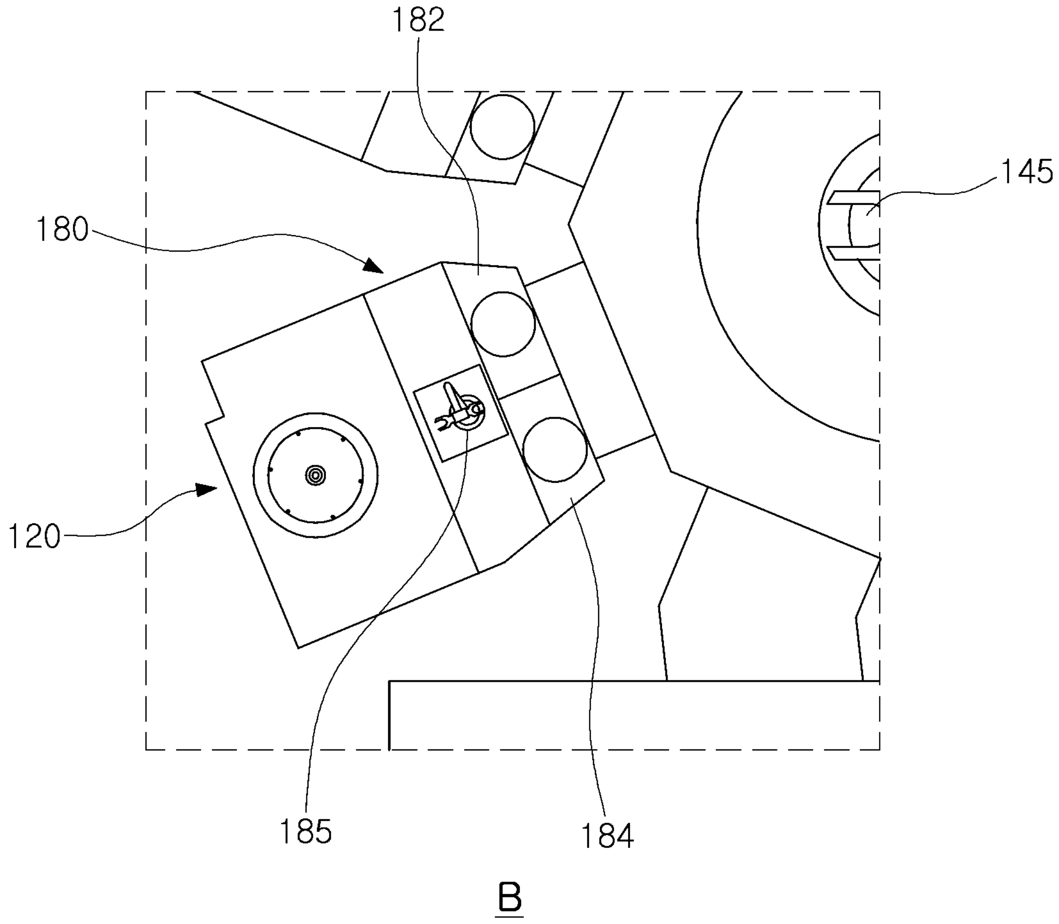
FIG. 5 is a schematic enlarged view illustrating portion B of FIG. 1 according to example embodiments of the present inventive concept.
Figure 6:
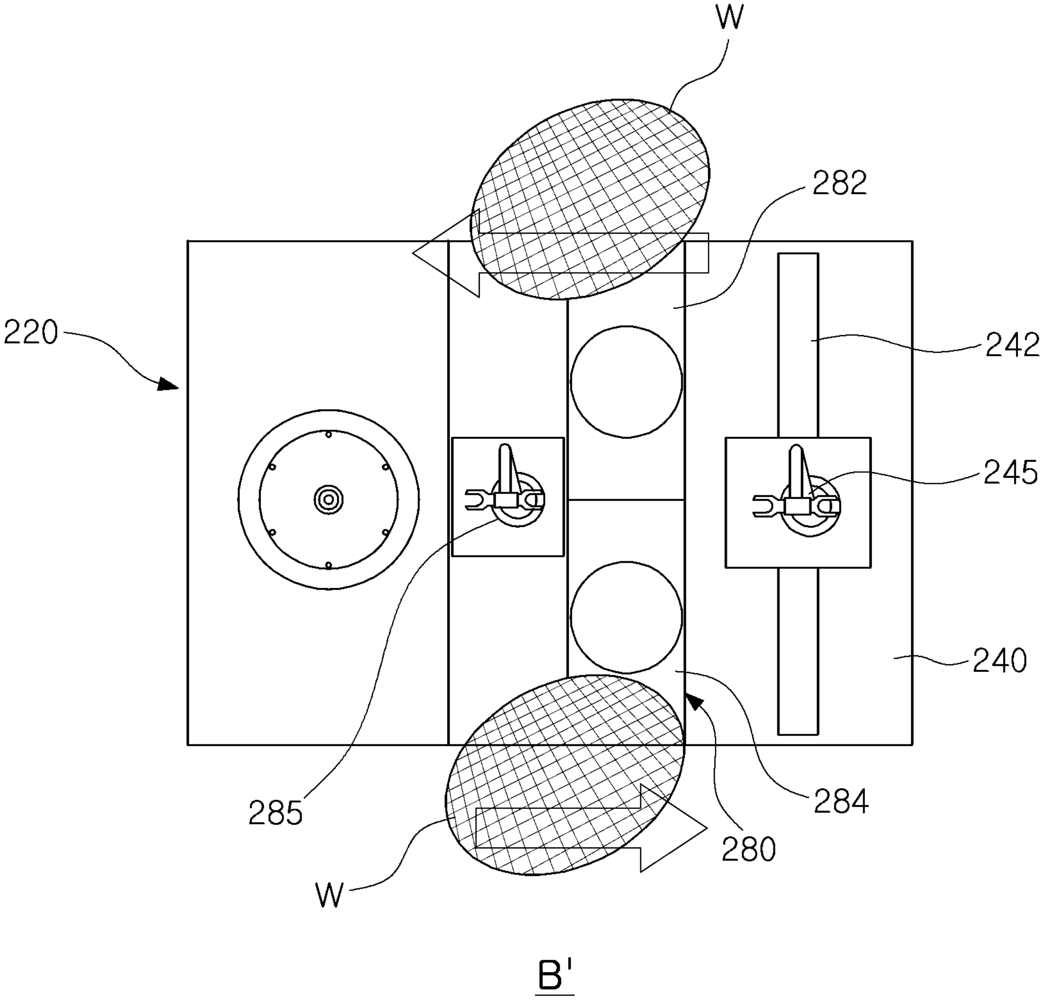
FIG. 6 is a schematic enlarged view illustrating portion B' of FIG. 2 according to example embodiments of the present inventive concept.
Figure 7:
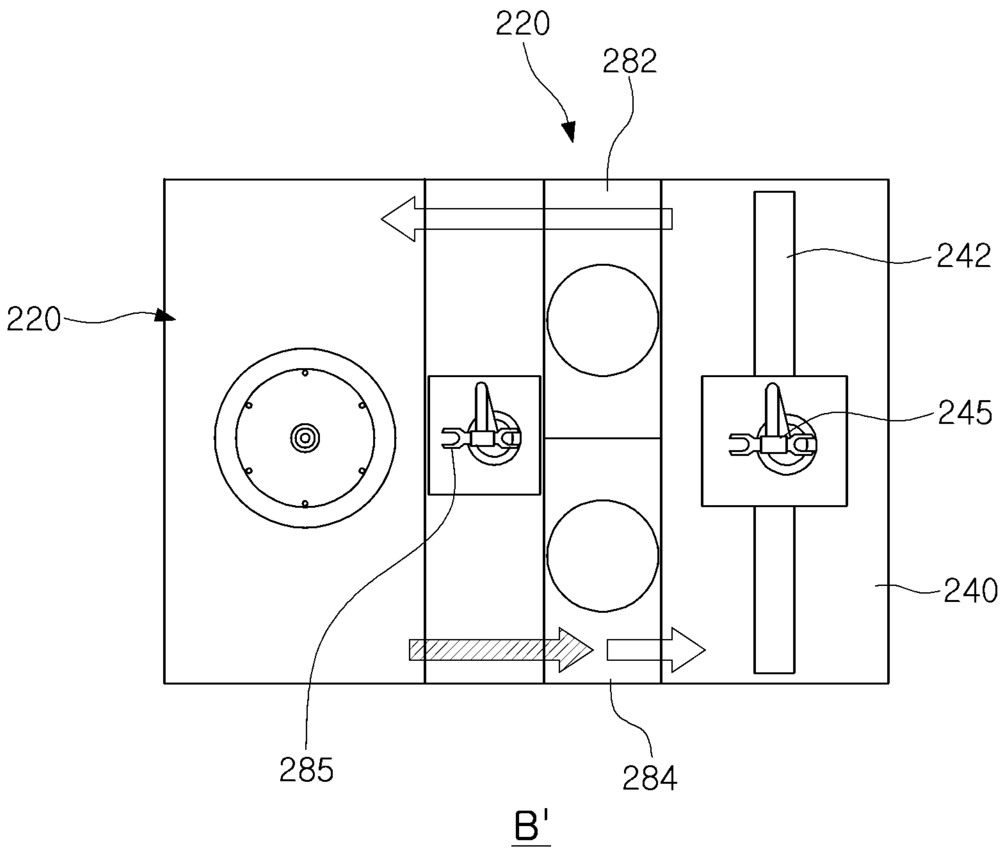
FIG. 7 is a schematic enlarged view illustrating portion B' of FIG. 2 according to other example embodiments of the present inventive concept.

FIG. 5 is a schematic enlarged view illustrating portion B of FIG. 1 according to example embodiments, and FIG. 6 is a schematic enlarged view illustrating portion B' of FIG. 2 according to example embodiments. In addition, FIG. 7 is a schematic enlarged view illustrating portion B' of FIG. 2 according to other example embodiments.

Referring to FIGS. 5 and 6, second interface boxes 180 and 280 of a cluster-type lithography track system and a track-type lithography track system, respectively, are illustrated.

Still referring to FIGS. 5 and 6, the second interface boxes 180 and 280 receive wafers from the transfer modules 140 and 240 between the process modules 120 and 220.

The second interface boxes 180 and 280 include wafer-in-chambers 182 and 282, wafer-out-chambers 184 and 284, and robot arms 185 and 285.

The wafer-in-chambers 182 and 282 are chambers disposed in a path through which the wafer W is introduced from the transfer modules 140 and 240 to the processing chambers 120 and 220 based on the second interface boxes 180 and 280. In addition, the wafer-out-chambers 184 and 284 are chambers disposed in a path through which the wafer W, on which the semiconductor process has been performed, is discharged from the processing chambers 120 and 220 to the transfer modules 140 and 240 based on the second interface boxes 180 and 280.

The robot arms 185 and 285 are between the wafer-in-chambers 182 and 282 and the wafer-out-chambers 184 and 284 and the process modules 120 and 220. The robot arms 185 and 285 transfer the wafer W from the wafer-in-chambers 182 and 282 to the process modules 120 and 220 and from the process modules 120 and 220 to the wafer-out-chambers 184 and 284.

The second interface boxes 180 and 280 manage spaces of the wafer-in-chambers 182 and 282 and the wafer-out-chambers 184 and 284 separately to reduce the possibility of metal contamination of the wafer W, thereby improving yield.

Referring to FIG. 7, the wafer-out-chambers 184 and 284 may include a cleaning module. As the process progresses in the processor module, contaminated wafers may be cleaned. At this time, the wafer-out-chambers 184 and 284 may be coupled to a plasma device, such as a remote plasma source (RPS) to remove contamination of the wafer-out-chambers 184 and 284.

Figure 8:
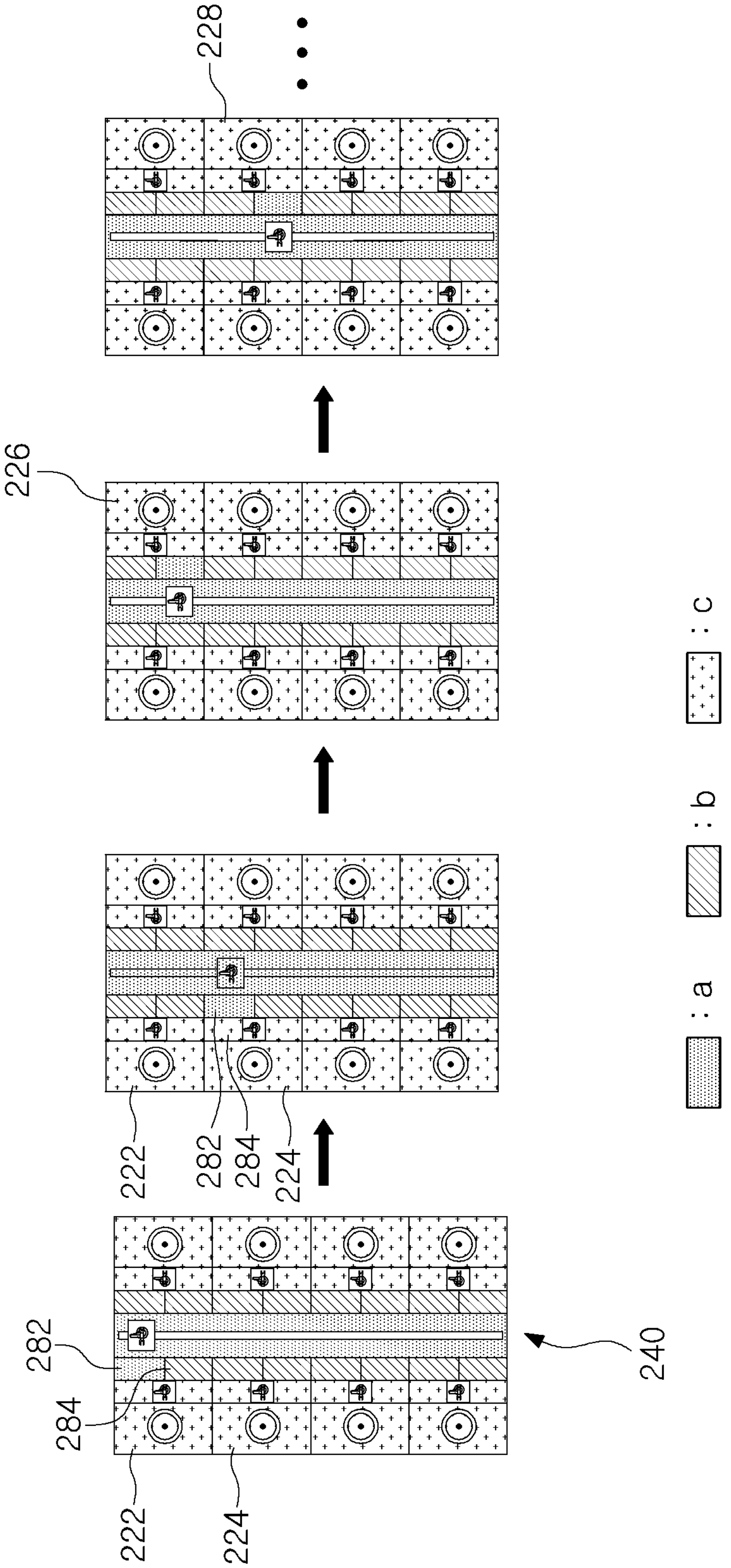
FIG. 8 is a schematic diagram illustrating a state in which a wafer is transferred to a process module in a track-type lithography track system according to example embodiments of the present inventive concept.

FIG. 8 is a schematic diagram of a wafer being transferred to a process module in a track-type lithography track system according to example embodiments of the present inventive concept.

Referring to FIG. 8, it can be seen that vacuum degree matching between the wafer-in-chamber 282 and the process module 222 is independent of vacuum degree matching between the wafer-in-chamber 282 and the transfer module 240.

In FIG. 8, a, b, and c show differences in pressure. For example, a is normal pressure, b is a pressure at which normal pressure and vacuum intersect, and c is a pressure in a vacuum state. Pressure may change depending on the type of process or a transfer method.

Various process modules 222, 224, 226, and 228 and the transfer module 240 of photolithography should maintain a certain vacuum degree, and each of the process modules 222, 224, 226, and 228 may have a different vacuum degree.

The wafer may be transferred only when the process modules 222, 224, 226, and 228 and the transfer module 240 have the same vacuum degree. The second interface box 280 is located between the process modules 222, 224, 226, and 228 and the transfer module 240, and when the vacuum degrees of the wafer-in-chamber 282 and the transfer module 240 match, the wafer is first transferred to the wafer-in-chamber 282 of the process module 222.

The vacuum degree matching between the first process module 222 and the wafer-in-chamber 282 is performed independently from the vacuum degree matching between the wafer-in-chamber 282 and the transfer module 240. When the vacuum degrees of the first process module 222 and the wafer-in-chamber 282 match, the wafer in the wafer-in-chamber 282 is transferred to the first process module 222. After a semiconductor process is performed in the first process module 222, the wafer is transferred to the wafer-out-chamber 284.

Vacuum degree matching with the transfer module 240 is prepared so that the wafer is transferred from the wafer-out-chamber 284 to other process modules 224, 226, and 228 and a subsequent photolithography semiconductor process is performed. The wafer-out-chamber 284 may be equipped with a cleaning unit or connected to a remote plasma source to clean the wafer contaminated in the first process module 222. The wafer cleaned in the wafer-out-chamber 284 does not spread contamination to the transfer module 240.

Like the first process module, the other process modules 224, 226, and 228 transfer wafers and perform respective semiconductor processes.

In this manner, since the second interface box 280 including the wafer-in-chamber 282 and the wafer-out-chamber 284 is located between the process modules 222, 224, and 226 and the transfer module 240, vacuum degree matching between the wafer-in-chamber 282 and the process modules 222, 224, and 226 may be performed independently of vacuum degree matching between the wafer-in-chamber and the transfer module, and thus, the process modules of the track system may operate independently of each other even without a vacuum degree matching operation with the transfer module, thereby significantly improving a work speed.

According to the lithography track system of example embodiments of the present inventive concept, which is a dry photolithography track system, the photolithography process may be continuously performed without moving a wafer to an external scanner for the exposure process and all photolithography processes may be performed as dry photolithography processes. Through the dry photolithographic process, patterns on semiconductor chips may be reliably further refined.

In addition, in the lithography track system with the in-line scanner, the exposure process may be performed continuously without moving a wafer to an external scanner, thereby eliminating the problem of contamination of the wafer, FOUP, and transfer module due to metal reaction by-products in the exposure process. Since the cleaning process to remove contamination is also reduced, the cost of installing a separate cleaning device may be reduced and process time and productivity may be improved.

Before introducing a wafer that has undergone a dry photography process into the scanner, a wafer handler operating under normal pressure conditions to move the wafer to the scanner may be removed and the wafer may be moved directly to the scanner through a transfer module that passes through the first interface box capable of vacuum adjustment, thereby eliminating vacuum degree matching delay for adjusting the vacuum degree at normal pressure.

The first interface box may be equipped with process modules capable of performing a necessary process before and after the exposure process, thereby timely performing the necessary processes before and after scanning to prevent contamination of the semiconductor wafer or additional problems that may arise, such as drift of a critical dimension.

In addition, since the second interface box, which is disposed between the process module and the transfer module, matches in the vacuum degree with the transfer module, and also matches in the vacuum degree with the process module, separate from the transfer module, is provided, the process modules of the track system may operate independently of each other even without a vacuum degree matching operation with the transfer module, thereby significantly improving a work speed.

While example embodiments have been shown and described above, it will be apparent to those skilled in the art that modifications and variations could be made without departing from the scope of the present inventive concept as defined by the appended claims.

What is claimed is:

1. A lithography track system comprising:

a plurality of process modules each configured to perform a photolithography process on a wafer;

a transfer module configured to transfer the wafer between the plurality of process modules;

a scanner at one end of the transfer module and configured to expose a photoresist material on the wafer;

a first interface box sharing the transfer module and configured to transfer the wafer to the scanner and to control pressure conditions to match a degree of vacuum of the transfer module with the scanner; and a second interface box between at least one of the plurality of process modules and the transfer module and configured to move the wafer to and from the transfer module, wherein the second interface box includes a wafer-in-chamber configured to separately control pressure conditions to match a degree of vacuum with the transfer module or the process module, wherein vacuum degree matching between the wafer-in chamber and the process module is performed independently of vacuum degree matching between the wafer-in chamber and the transfer module.

2. The lithography track system of claim 1, wherein the plurality of process modules include:

a coating process module configured to coat the wafer with photoresist;

a baking process module configured to bake the coated or exposed wafer; and a dry development module configured to dry-remove the exposed wafer or a pattern thereon.

3. The lithography track system of claim 1, wherein the first interface box includes at least one of a baking process module, an alignment module, a buffer module, and a cleaning module.

4. The lithography track system of claim 1, wherein the transfer module is coupled to a plasma device within the first interface box.

5. The lithography track system of claim 1, wherein the second interface box includes:

a wafer-out-chamber configured to transfer the wafer from the process module to the transfer module; and a robot arm between the wafer-in-chamber and the wafer-out-chamber and the process module, and configured to transfer the wafer from the wafer-in-chamber to the process module and from the process module to the wafer-out-chamber.

6. The lithography track system of claim 5, wherein the wafer-out-chamber includes a cleaning module.

7. The lithography track system of claim 1, wherein an arrangement of the process module and the transfer module is a cluster-type.

8. The lithography track system of claim 1, wherein an arrangement of the process module and the transfer module is a track-type.

9. A lithography track system, in which a wafer is sequentially transferred to a plurality of process modules and processed sequentially or simultaneously in the plurality of process modules, the lithography track system comprising:

a transfer module configured to transfer the wafer between the plurality of process modules, wherein the plurality of process modules include:

a coating process module configured to dry-coat the wafer with photoresist;

a scanner configured to expose the coated wafer to electromagnetic radiation;

a baking process module configured to dry-bake the coated or exposed wafer;

a dry development module configured to dry-remove the exposed wafer or a pattern thereon;

a first interface box configured to control pressure conditions to match a degree of vacuum with the scanner at an introduction side of the scanner; and a second interface box between at least one of the plurality of process modules and the transfer module and configured to move the wafer to and from the transfer module, wherein the second interface box includes a wafer-in-chamber configured to separately control pressure conditions to match a degree of vacuum with the transfer module or the process module, wherein vacuum degree matching between the wafer-in chamber and the process module is performed independently of vacuum degree matching between the wafer-in chamber and the transfer module.

10. The lithography track system of claim 9, wherein the first interface box is formed continuously with the transfer module and includes at least one of a baking process module, an alignment module, a buffer module, and a cleaning module.

11. The lithography track system of claim 9, wherein the transfer module is coupled to a plasma device within the first interface box.

12. The lithography track system of claim 9, wherein the second interface box includes:

a wafer-out-chamber configured to transfer the wafer from the process module to the transfer module; and a robot arm between the wafer-in-chamber and the wafer-out-chamber and the process module, and configured to transfer the wafer from the wafer-in-chamber to the process module and from the process module to the wafer-out-chamber.

13. A lithography track system comprising:

an equipment front-end module configured to supply a wafer;

a plurality of process modules configured to sequentially or simultaneously process the wafer;

a transfer module having a first end connected to the equipment front-end module and configured to transfer the wafer; and an interface box disposed between at least one of the plurality of process modules and the transfer module and configured to move the wafer to and from the transfer module and the at least one of the plurality of process modules, wherein the interface box includes a wafer-in-chamber configured to separately control pressure conditions to match a degree of vacuum with the transfer module or the process module, wherein vacuum degree matching between the wafer-in chamber and the process module is performed independently of vacuum degree matching between the wafer-in chamber and the transfer module.

14. The lithography track system of claim 13, wherein the interface box includes:

a wafer-out-chamber configured to transfer the wafer from the process module to the transfer module; and a robot arm between the wafer-in-chamber and the wafer-out-chamber and the process module, and configured to transfer the wafer from the wafer-in-chamber to the process module and from the process module to the wafer-out-chamber.

15. The lithography track system of claim 13, further comprising:

a scanner connected to a second end of the transfer module that is opposite the first end of the transfer module; and a first interface box in-line with the transfer module adjacent the scanner and configured to match vacuum degrees of the transfer module and the scanner.

16. The lithography track system of claim 15, wherein a moving rail of the transfer module is connected to the scanner, a plurality of process modules are arranged on opposing sides of the transfer module, and the plurality of process modules include:

a coating process module configured to coat the wafer with photoresist;

a baking process module configured to bake the coated or exposed wafer; and a dry development module configured to dry-remove the exposed wafer or a pattern thereon.

17. The lithography track system of claim 15, wherein the first interface box includes at least one of a baking process module, an alignment module, a buffer module, and a cleaning module.

* * * * *